(12) United States Patent
Shin et al.

(10) Patent No.: US 6,852,625 B2
(45) Date of Patent: Feb. 8, 2005

(54) PACKAGE SUBSTRATE MANUFACTURED USING ELECTROLYTIC LEADLESS PLATING PROCESS, AND METHOD FOR MANUFACTURING THE SAME

(75) Inventors: Young-Hwan Shin, Daejeon-si (KR); Chong-Ho Kim, Chungchungbuk-do (KR); Tae-Gui Kim, Chungchungbuk-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 10/617,726

(22) Filed: Jul. 14, 2003

(65) Prior Publication Data

US 2004/0113244 A1 Jun. 17, 2004

(30) Foreign Application Priority Data

Dec. 12, 2002 (KR) ................................ 10-2002-0079217

(51) Int. Cl.[7] .............................. H01L 21/44; H05K 3/00
(52) U.S. Cl. ...................... 438/678; 438/687; 29/829; 29/830; 29/846; 29/852; 29/874
(58) Field of Search ................................ 438/678, 687; 29/829, 830, 846, 852, 874

(56) References Cited

U.S. PATENT DOCUMENTS

2002/0189849 A1 * 12/2002 Hirose et al. ............... 174/250

* cited by examiner

*Primary Examiner*—Craig A. Thompson
*Assistant Examiner*—Nema Berezny
(74) *Attorney, Agent, or Firm*—Morgan, Lewis & Bockius LLP

(57) ABSTRACT

A package substrate of, for example, a BGA type or a CSP type, manufactured by carrying out an electrolytic Au plating process without using any plating lead line for formation of bond fingers and solder ball pads, and a method for manufacturing the package substrate. The method includes the steps of laminating first dry films over upper and lower surfaces of a base substrate having via holes while being formed at its upper and lower surfaces with copper foils, and patterning the first dry films to expose predetermined surface portions of the base substrate, removing portions of the copper foils not covered by the first dry films to form circuits, stripping the first dry films, and forming a plated layer over the base substrate, laminating second dry films over the plated surfaces of the base substrate, and patterning the second dry films to expose portions of the plated surfaces of the base substrate corresponding to regions where Au is to be plated, removing the plated layer from the exposed surface portions of the base substrate corresponding to the Au plating regions, plating Au on the exposed surface portions of the base substrate, stripping the second dry films, and removing the remaining plated layer to expose the circuits, and coating a solder resist on the exposed circuits while exposing predetermined portions of the circuits.

14 Claims, 17 Drawing Sheets

PACKAGE SUBSTRATE MANUFACTURED USING ELECTROLYTIC LEADLESS PLATING PROCESS, AND METHOD FOR MANUFACTURING THE SAME

BACKGROUND OF THE INVENTION

1. Field of the Invention

The present invention relates to a package substrate manufactured using an electrolytic leadless plating process, and a method for manufacturing the same. More particularly, the present invention relates to a package substrate of, for example, a ball grid array (BGA) type or a chip scale package (CSP) type, manufactured by carrying out an electrolytic Au plating process without using any plating lead line for formation of bond fingers to be connected with a semiconductor chip mounted on a base substrate, and solder ball pads, and a method for manufacturing the same.

2. Description of the Related Art

In spite of the recent tendency of integrated circuits to have a light, thin, simple and miniature structure, integrated circuit packages rather tend to have an increased number of leads extending outwardly therefrom. One method capable of solving problems caused by installation of a number of leads on a carrier for a miniature package is to use a carrier having a pin grid array (PGA). Although such a PGA carrier can have a number of leads while having a miniature size, it has a drawback in that its pins or leads may be easily broken due to their low strength, and there is a limitation to its high-density integration.

In order to solve such drawbacks involved with PGA, use of BGA package substrates has recently been generalized. The reason why such a BGA package substrate has been generally used is that it is possible to easily achieve a high-density integration of the substrate in accordance with use of solder balls finer than pins. Such a BGA package substrate is mainly used for a package substrate adapted to mount a semiconductor chip thereon.

A conventional example of such a BGA package will be described in brief hereinafter. Referring to FIG. 1, a conventional BGA package is shown which has a structure formed with solder balls 8, in place of conventional pins. In order to fabricate this structure, a plurality of copper clad laminates (CCLs) 4 are first prepared. An inner-layer circuit is formed at each of the CCLs 4 in accordance with a well-known photolithography process. The CCLs 4 are then laminated in accordance with a pressing process. Thereafter, via holes 2 are formed at the laminated CCL structure in order to electrically connect the inner-layer circuits of respective CCLs. The via holes 2 are plated with a copper film 3 so that they are electrically connected. An outer-layer circuit 6 is subsequently formed at the outermost CCL 4 of the laminated CCL structure in accordance with a photolithography process. The outer-layer circuit 6 has bond fingers 1 to be connected with a semiconductor chip mounted on the laminated CCL structure. Thereafter, solder ball pads 7, a solder mask 5, and solder balls 8 are sequentially formed at a surface of the laminated CCL structure opposite to the outer-layer circuit 6.

Meanwhile, Au-plating lead lines are formed in order to perform a plating process adapted to obtain improved electrical connections of the pads 7 with both the bond fingers 1 connected to the semiconductor chip and the solder balls 8. Each Au-plating lead line is connected to an associated one of the pads 7 connected to respective solder balls 8. Although not shown, the Au-plating lead lines are also connected to the bond fingers 1 via the pads 7 and via holes 2, respectively. FIG. 2 is a plan view illustrating the package substrate plated using conventional plating lead lines. As shown in FIG. 2, plating lead lines 9 are connected to respective solder ball pads 7 at which respective solder balls 8 are formed. The area where the plating lead lines 9 are formed corresponds to the portion A of FIG. 1. Substantially, there is a limitation to high-density integration in designing a circuit, due to such plating lead lines.

On the other hand, an integrated circuit (IC) chip is mounted on the CCL 4 formed with the outer-layer circuit 6, while being connected with the outer-layer circuit 6 by conductive lines. An encapsulant is coated over the CCL 4 to protect the CCL 4 from the surroundings. Thus, the BGA package substrate 10 is connected with a main circuit board by the solder balls 8 formed at the pads 7 of the pad-carried CCL 4, as compared to a PGA substrate which is connected to a main circuit board by pins. For this reason, it is possible to easily miniaturize BGAs, as compared to PGAs. Accordingly, the BGA substrate 10 can achieve high-density integration.

However, the above mentioned conventional BGA package substrate 10 involves a problem in that it is difficult to achieve high-density integration of the Au-plating lead lines adapted to carry out an Au plating process for the bond fingers 1 and pads 7 because the pitch of the solder balls 8 in the BGA package substrate, that is, the space between adjacent solder balls, is rendered to be very small due to high-density integration of circuits and miniaturization of devices using such circuits, and because of high-density integration of circuits arranged around the bond fingers 1 of the outer-layer circuit mounted with the semiconductor chip thereon.

Now, a conventional method for manufacturing a package substrate plated with Au using plating lead lines will be described with reference to FIGS. 3a to 3f.

In order to manufacture a package substrate provided with desired circuits, dry films 15 are first coated over upper and lower surfaces of a base substrate, a CCL. Each dry film 15 is then subjected to exposure and development processes, so that it is patterned to have a desired pattern for formation of a desired circuit. The CCL includes an insulator 11, and copper foils 12 respectively coated over upper and lower surfaces of the insulator 11. Practically, the patterning of the dry films 15 for formation of desired circuits is carried out after completion of processes for forming via holes 13 at the CCL by use of a mechanical drill, and plating a copper film 14 covering each copper foil 12 and each via hole 13.

Thereafter, the copper films 14 and copper foils 12 are partially etched, using the patterned dry films 15 as etch resists. That is, exposed portions of the copper films 14 and copper foils 12 are removed by an etchant, thereby forming desired circuits (FIG. 3b). In this etching process, plating lead lines to be used in a subsequent Au plating process are also formed. In FIG. 3b, the reference numeral 16 denotes a region where exposed copper is etched.

After completion of the etching process, the dry films 15 used as etch resists are removed using a stripping solution (FIG. 3c).

A solder resist 17 is then coated over the entire exposed surface of the resultant structure. The solder resist 17 is patterned in accordance with exposure and development processes, and then dried (FIG. 3d).

An Au film 18 is plated on wire bonding pads and solder ball pads included in respective circuits by applying current to the previously formed plating lead lines. The plating of the Au film 18 may be achieved in accordance with an electrolytic Ni—Au plating process. Typically, the thickness of the plated Au film 18 is about 0.5 to 1.0 µm (FIG. 3e).

Generally, an electrolytic Au plating process is mainly used for metal finishing of the surface of a package substrate on which a semiconductor chip is mounted, because it is superior over an electroless Au plating process, in terms of reliability. For such an electrolytic Au plating process, however, it is necessary to design the package substrate to be provided with plating lead lines. For this reason, there is a reduction in line density. Such a reduced line density causes a problem in manufacturing a circuit having a high-density integration.

Thereafter, the plating lead lines are cut using a router or a dicing process (FIG. 3f). In FIG. 3f, the reference numeral 19 denotes a region where the dicing process is carried out. That is, the plating lead lines are cut using the router or dicing process, after completion of the electrolytic Au plating process. However, the plating lead lines are incompletely removed from the package substrate. The residues of the plating lead lines may cause noise during transmission of electrical signals in the circuits provided at the package substrate. As a result, there is a degradation in electrical performance.

SUMMARY OF THE INVENTION

The present invention has been made in view of the above mentioned problems, and an object of the invention is to provide a package substrate manufactured using an electrolytic leadless plating process, thereby being capable of achieving an improvement in line density, and a method for manufacturing the package substrate.

Another object of the invention is to provide a package substrate capable of completely removing all plating lead lines used in a normal electrolytic Au plating process, thereby achieving suppression of noise.

In accordance with one aspect, the present invention provides a method for manufacturing a package substrate without using any plating lead line, comprising the steps of: a) laminating first dry films over upper and lower surfaces of a base substrate having via holes plated with a copper film and being formed at the upper and lower surfaces thereof with copper foils, and subjecting the first dry films to exposure and development processes, thereby exposing predetermined upper and lower surface portions of the base substrate; b) removing portions of the copper foils not covered by the first dry films in accordance with an etching process, thereby forming circuits on the upper and lower surfaces of the base substrate, respectively; c) stripping the first dry films, and forming a plated layer over all portions of the base substrate in accordance with an electroless plating process; d) laminating second dry films over the plated upper and lower surfaces of the base substrate, and subjecting the second dry films to exposure and development processes, thereby exposing portions of the plated upper and lower surfaces of the base substrate respectively corresponding to regions where Au is to be plated; e) removing the plated layer from the exposed upper and lower surface portions of the base substrate respectively corresponding to the regions where Au is to be plated, in accordance with an etching process; f) plating Au on the exposed upper and lower surface portions of the base substrate; g) stripping the second dry films, and removing the plated layer remaining on the base substrate in accordance with an etching process, thereby exposing the upper and lower circuits of the base substrate; and h) coating a solder resist on the exposed upper and lower circuits of the base substrate while exposing predetermined portions of the upper and lower circuits.

Preferably, the first and second dry films are used as etch resists, respectively.

Preferably, the electroless plating process is carried out by chemically plating a conductor in a state in which bus lines of the upper and lower circuits are completely removed after completion of the etching process at the step (b). The conductor may be a copper layer having a thickness of 0.5 to 1.0 µm.

Each of the etching processes may be a flash etching process.

Preferably, the plated layer formed in the electroless plating process is a conductor serving as a plating lead line for supplying current during the electroless plating process.

The exposed upper surface portions of the base substrate respectively corresponding to the regions where Au is to be plated may be bond fingers, whereas the exposed lower surface portions of the base substrate respectively corresponding to the regions where Au is to be plated may be solder ball pads.

In accordance with another aspect, the present invention provides a method for plating Au on a package substrate, comprising the steps of: a) laminating first dry films over upper and lower surfaces of a base substrate having via holes plated with a copper film and being formed at the upper and lower surfaces thereof with copper foils, and subjecting the first dry films to exposure and development processes, thereby exposing predetermined upper and lower surface portions of the base substrate; b) removing portions of the copper foils not covered by the first dry films in accordance with an etching process, thereby forming circuits on the upper and lower surfaces of the base substrate, respectively; c) stripping the first dry films, and forming a plated layer over all portions of the base substrate in accordance with an electroless plating process; d) laminating second dry films over the plated upper and lower surfaces of the base substrate, and subjecting the second dry films to exposure and development processes, thereby exposing portions of the plated upper and lower surfaces of the base substrate respectively corresponding to regions where Au is to be plated; e) removing the plated layer from the exposed upper and lower surface portions of the base substrate respectively corresponding to the regions where Au is to be plated, in accordance with an etching process; and f) plating Au on the exposed upper and lower surface portions of the base substrate, whereby the base substrate is plated with Au without using any plating lead line.

Preferably, the electroless plating process is carried out by chemically plating a conductor in a state in which bus lines of the upper and lower circuits are completely removed after completion of the etching process at the step (b). The conductor may be a copper layer having a thickness of 0.5 to 1.0 µm.

The conductor formed in accordance with the electroless plating process serves as a plating lead line for supplying current during the electrolytic plating process for plating of Au.

In accordance with another aspect, the present invention provides a method for electrolytically plating Au on a package substrate without using any plating lead line, comprising the steps of: a) laminating first dry films over upper and lower surfaces of a base substrate having via holes plated with a copper film and being formed at the upper and lower surfaces thereof with copper foils, and subjecting the first dry films to exposure and development processes, thereby exposing predetermined upper and lower surface portions of the base substrate; b) removing portions of the copper foils not covered by the first dry films in accordance with an etching process, thereby forming circuits on the upper and lower surfaces of the base substrate, respectively; c) stripping the first dry films, and forming a plated layer over all portions of the base substrate in accordance with an electroless plating process; d) laminating second dry films over the plated upper and lower surfaces of the base substrate, and subjecting the second dry film laminated over the plated upper surface of the base substrate to exposure and development processes, thereby exposing predetermined portions of the plated upper surface of the base substrate, while tenting the via holes; e) removing the plated layer from the exposed upper surface portions of the base substrate in accordance with an etching process; f) laminating a third dry film over an upper surface of a structure obtained after completion of the step (e), subjecting the third dry film to exposure and development processes, thereby exposing portions of the upper surface of the base substrate respectively corresponding to regions where Au is to be plated, and plating Au on the exposed upper surface portions of the base substrate; g) stripping the second dry film laminated on the lower surface of the substrate, and the third dry film remaining on the upper surface of the structure, and removing the plated layer remaining on the lower surface of the base substrate in accordance with an etching process, thereby exposing the upper and lower circuits of the base substrate; h) coating a solder resist over the exposed upper and lower circuits of the base substrate, and subjecting the solder resist to exposure and development processes, thereby exposing predetermined portions of the upper and lower circuits; and i) surface-treating the exposed portions of the lower circuit by use of an organic solderability preservative agent.

In accordance with another aspect, the present invention provides a package substrate plated with Au in accordance with an electrolytic Au plating process using no plating lead line, comprising: a base substrate formed with a plurality of via holes; a first plated layer formed on predetermined portions of the base substrate and respective inner surfaces of the via holes to form circuit patterns at upper and lower surfaces of the base substrate, respectively, the first plated layer being made of copper; a second plated layer formed on predetermined portions of the circuit patterns in accordance with an electroless plating process; an Au plated layer formed on portions of the circuit patterns corresponding to regions where the second plated layer is not present; and a solder resist coated on the circuit patterns, except for the Au plated layer thereof.

Preferably, the second plated layer is a conductor chemically plated in an electroless manner in a state in which bus lines of the upper and lower circuits are completely removed.

Preferably, the plated layer serves as a plating lead line for supplying current during an electrolytic plating process for the formation of the Au plated layer.

Thus, in accordance with the present invention, it is possible to manufacture a package substrate without using any plating lead line by chemically plating the conductor in an electroless manner in a state in which the bus lines of the upper and lower circuits are completed removed, and using the conductor as a plating lead line for supplying current during the electrolytic plating process for plating of Au. Accordingly, it is possible to achieve an improvement in the line density of the package substrate while avoiding generation of noise, by virtue of elimination of plating lead lines.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Now, a package substrate manufactured using an electrolytic leadless plating process and a method for manufacturing the same in accordance with each embodiment of the present invention will be described in detail.

First Embodiment

FIGS. 5a to 5j are views illustrating processes for manufacturing a package substrate without using any plating lead line in accordance with a first embodiment of the present invention, respectively. The package substrate and its manufacturing method will be described in conjunction with FIGS. 5a to 5j.

Figure 5A:
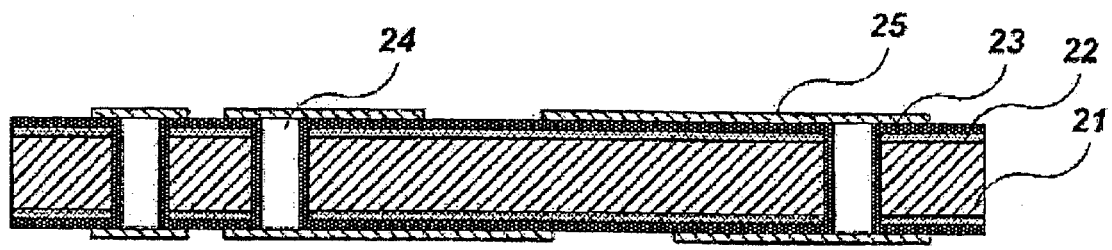
FIGS. 5a to 5j are views respectively illustrating processes for manufacturing a package substrate without using any plating lead line in accordance with a first embodiment of the present invention.

First, first dry films 25 are first coated over upper and lower surfaces of a base substrate, a CCL. The CCL is provided with via holes 24 plated with a copper film. Each dry film 15 is then subjected to exposure and development processes, so that the substrate is partially exposed (FIG. 5a).

Although the base substrate is illustrated as consisting of a single-layer CCL structure, it may consist of a multi-layer CCL structure including a plurality of laminated CCLs. The CCL includes an epoxy substrate, that is, an insulator, 21, and copper foils 22 respectively laminated over upper and lower surfaces of the insulator 21. Each copper foil 22 is bonded to the insulator 21 by a conductive adhesive. The CCL is formed with an inner-layer circuit having a ground pattern or signal processing pattern in accordance with a photolithography process. The via holes 24 serve to electrically connect circuits respectively provided at upper and lower surfaces of the CCL. In order to electrically connect the circuits, a first plated layer 23 made of copper is formed at the CCL in accordance with a copper plating process. In the illustrated case, the first plated layer 23 is formed on an inner surface of each via hole 24 and each copper foil 22. One of the upper and lower circuits is provided with bond fingers to which a semiconductor chip is connected.

Figure 5B:
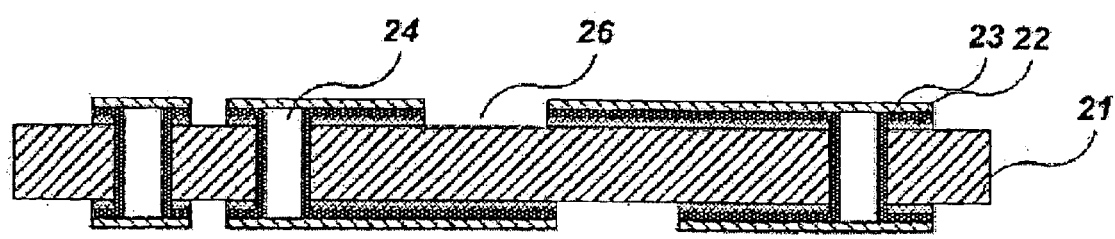

Exposed portions of the first plated layer 23 and copper foils 22 not covered with the first dry films 25 are removed in accordance with an etching process. Thus, desired circuits are formed at upper and lower surfaces of the base substrate, that is, the CCL (FIG. 5b). In FIG. 5b, the reference numeral 26 denotes a region where exposed copper is etched.

After a process of coating and bonding a dry film, to be used as an etch resist, over and to the associated copper foil, the process of etching each first dry film 25 may be carried out by irradiating light onto the etch resist under the condition in which the etch resist is partially blocked, curing the etch resist, applying a developer to the etch resist to remove uncured portions of the etch resist, and applying an etchant to exposed portions of the copper foil corresponding to regions where the etch resist is removed, thereby etching the exposed portions of the copper foil.

Figure 5C:
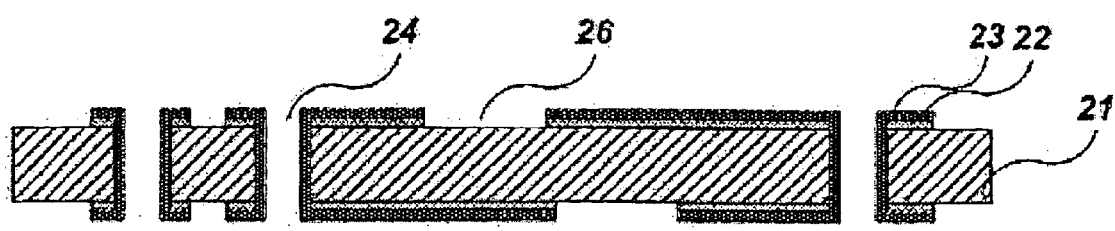
Figure 5D:
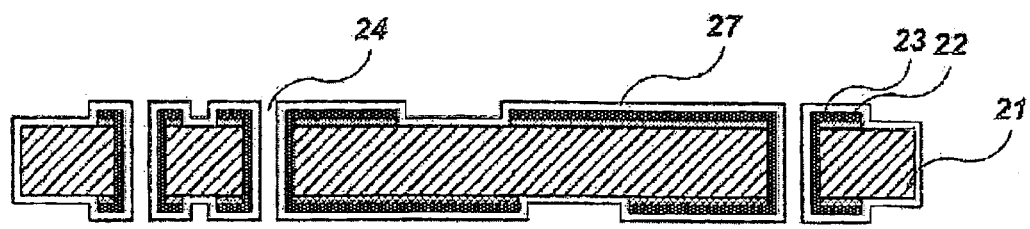

Thereafter, the first dry films 15 are stripped (FIG. 5c). A second plated layer 27 is then formed over the entire surface of the base substrate in accordance with an electroless plating process (FIG. 5d).

The electroless plating process is a process of chemically plating a conductor on the entire surface of the base substrate under the condition in which bus lines are completely removed from the upper and lower circuits after the etching process. The conductor may be a copper (Cu) film having a thickness of 0.5 to 1.0 $\mu$m. The conductor formed in accordance with an electroless chemical plating process serves as a plating lead line to supply current during a subsequent electrolytic plating process for circuit portions to be plated with Au.

Figure 5E:
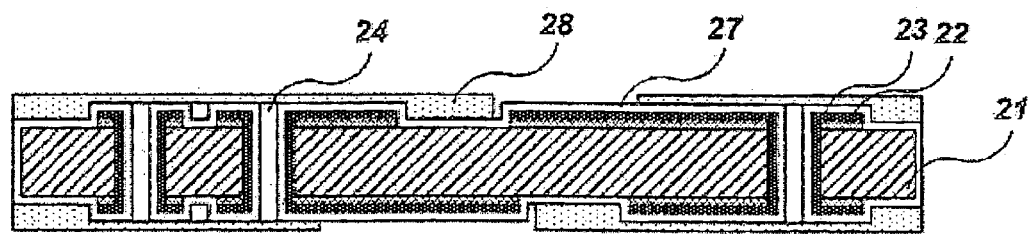

Thereafter, second dry films 28 are laminated over the second plated layer 27. Each second dry film 28 is then subjected to exposure and development processes, thereby exposing portions of the second plated layer 27 corresponding to regions where Au is to be plated (FIG. 5e).

Figure 5F:
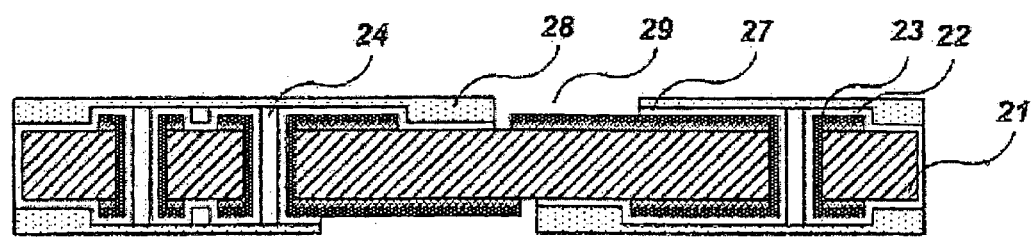

The exposed potions of the second plated layer 27 corresponding to respective regions where Au is to be plated are then removed in accordance with a flash etching process (FIG. 5f). In FIG. 5f, the reference numeral 29 denotes a region where the second plated layer 27 is removed by the etching process.

Figure 5G:
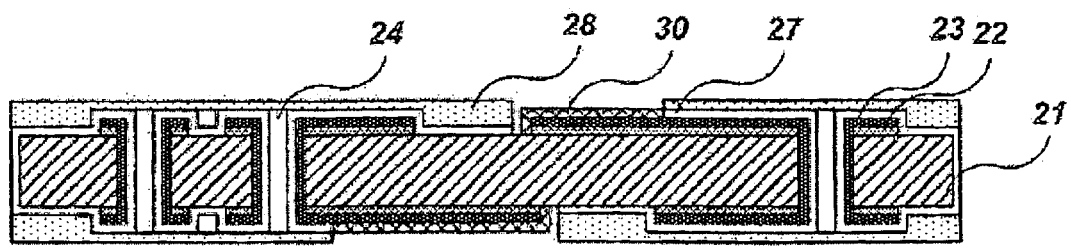

Subsequently, Au is plated on portions of the upper and lower circuits corresponding to respective regions where Au is to be plated, thereby forming Au plated layers 30 on those circuit portions (FIG. 5g). The upper circuit portions to be plated with Au may be bond fingers, whereas the lower circuit portions to be plated with Au may be solder ball pads.

Figure 5H:
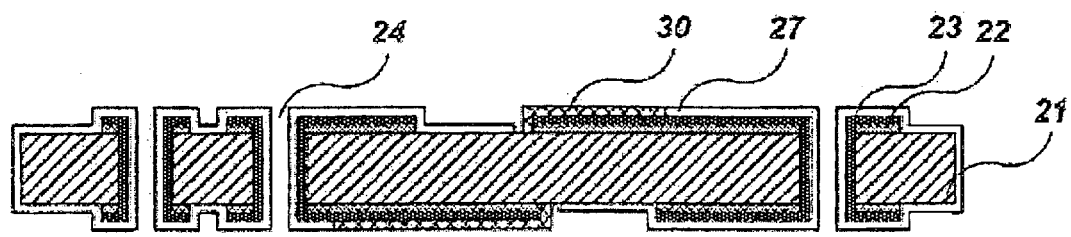
Figure 5I:
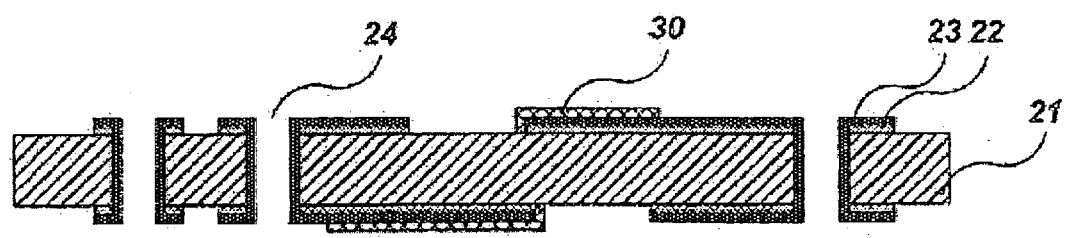

The second dry films 28 are then stripped (FIG. 5h). The residue of the second plated layer 27 is removed in accordance with an etching process (FIG. 5i). For this etching process, the above described flash etching process is used. Thus, the second plated layer 27, which is formed in accordance with an electroless plating process, is completely removed after being used as a plating lead line for electrolytic plating of the Au plated layer 30.

Figure 5J:
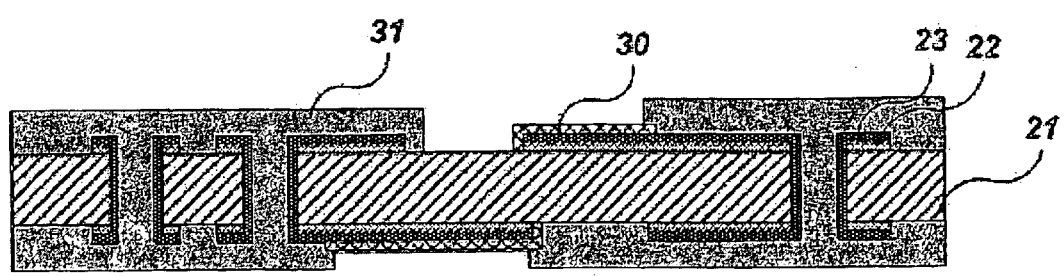

Finally, a solder resist 31 is then coated over the entire exposed surface of the resultant structure, and then patterned. Thus, a package substrate with desired upper and lower circuits is completed. (FIG. 5j).

Second Embodiment

FIGS. 6a to 6j are views illustrating processes for manufacturing a package substrate without using any plating lead line in accordance with a second embodiment of the present invention, respectively.

Figure 6A:
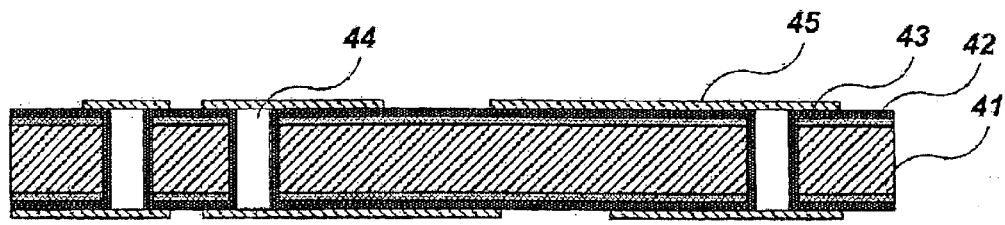
FIGS. 6a to 6j are views respectively illustrating processes for manufacturing a package substrate without using any plating lead line in accordance with a second embodiment of the present invention.

First, first dry films 45 are first coated over upper and lower surfaces of a base substrate, respectively. The base substrate is provided with via holes 44 plated with a copper film. Each dry film 45 is then subjected to exposure and development processes, so that the substrate is partially exposed (FIG. 6a). Although the base substrate is illustrated as consisting of a single-layer CCL structure, it may consist of a multi-layer CCL structure including a plurality of laminated CCLs. In FIG. 6a, the reference numeral 41 is an insulator, and the reference numeral 42 denotes copper foils respectively laminated over upper and lower surfaces of the insulator 41.

The via holes 44 serve to electrically connect circuits respectively provided at upper and lower surfaces of the base substrate. In order to electrically connect the circuits, a first plated layer 43 made of copper is formed at the base substrate in accordance with a copper plating process. In the illustrated case, the first plated layer 43 is formed on an inner surface of each via hole 44 and each copper foil 42. One of the upper and lower circuits is provided with bond fingers to which a semiconductor chip is connected.

Figure 6B:
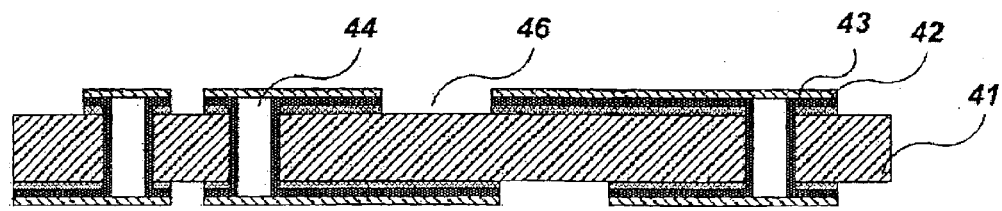

Exposed portions of the first plated layer 43 and copper foils 42 not covered with the first dry films 45 are removed in accordance with an etching process. Thus, desired circuits are formed at upper and lower surfaces of the base substrate (FIG. 6b). In FIG. 6b, the reference numeral 46 denotes a region where exposed copper is etched.

After a process of coating and bonding a dry film, to be used as an etch resist, over and to the associated copper foil, the process of etching each first dry film 45 may be carried out by irradiating light onto the etch resist under the condition in which the etch resist is partially blocked, curing the etch resist, applying a developer to the etch resist to remove uncured portions of the etch resist, and applying an etchant to exposed portions of the copper foil corresponding to regions where the etch resist is removed, thereby etching the exposed portions of the copper foil.

Figure 6C:
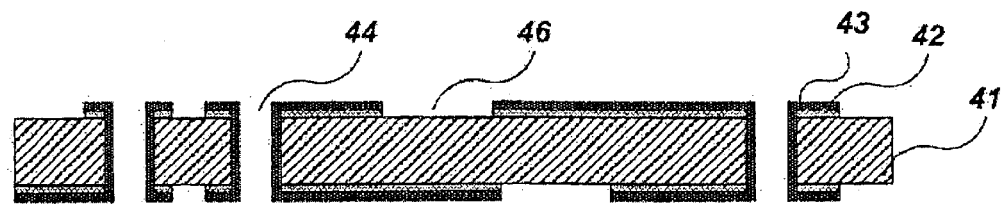
Figure 6D:
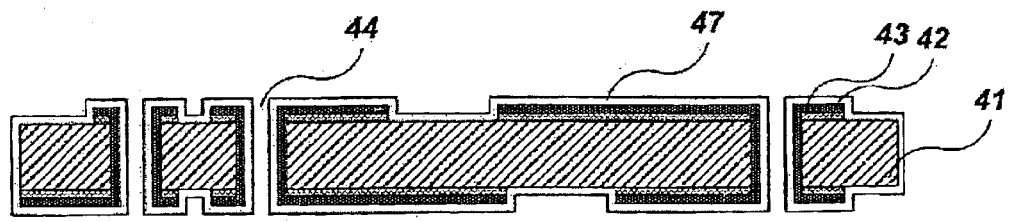

Thereafter, the first dry films 45 are stripped (FIG. 6c). An etch resist is then applied to the resultant structure so as to form upper and lower circuit patterns. An electrolytic plating process is then carried out to form a second plated layer 47 on the entire surface of the base substrate (FIG. 6d).

The electroless plating process is a process of chemically plating a conductor on the entire surface of the base substrate under the condition in which bus lines are completely removed from the upper and lower circuits after the etching process. The conductor may be a copper (Cu) film having a thickness of 0.5 to 1.0 $\mu$m. The conductor formed in accordance with an electroless chemical plating process serves as a plating lead line to supply current during a subsequent electrolytic plating process for circuit portions to be plated with Au.

Figure 6E:
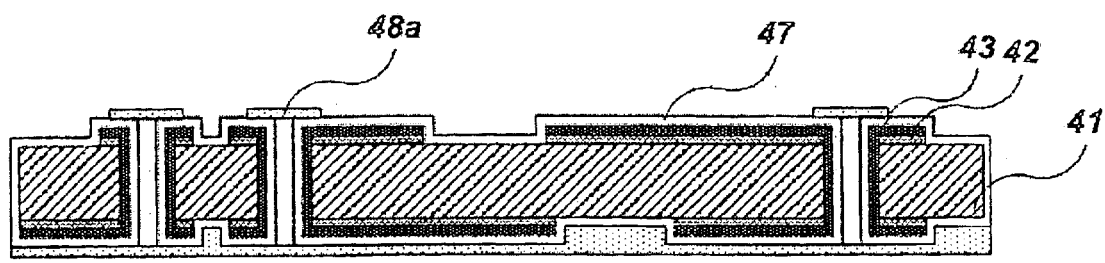

Thereafter, second dry films 48a are laminated over the upper and lower surfaces of the resultant structure, respectively. The upper second dry film 48a is then subjected to exposure and development processes so that it is partially removed to partially expose the second plated layer 47 (FIG. 6e). The remaining upper second dry film 48a tents respective via holes, so as to allow application of a flash etching process.

Figure 6F:
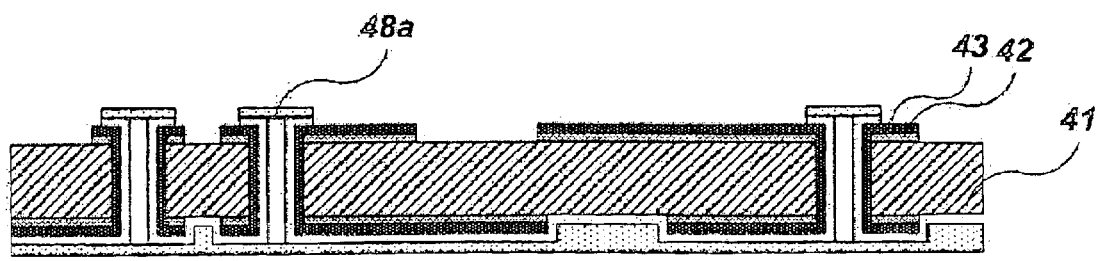

The exposed potions of the second plated layer 47 are then removed in accordance with a flash etching process (FIG. 6f).

Figure 6G:
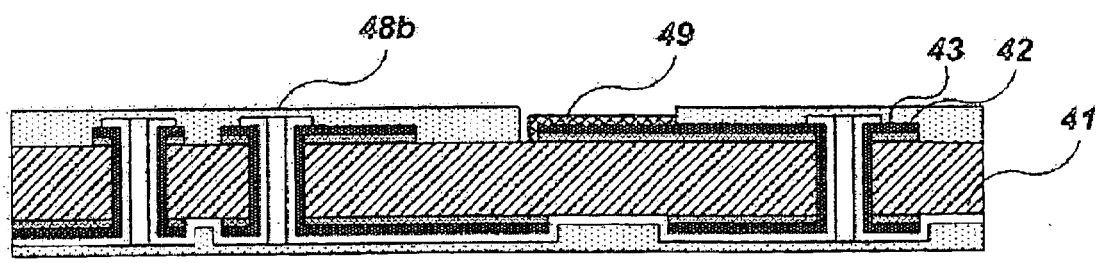

Thereafter, a third dry film 48b is laminated over the upper surface of the resultant structure. The third dry film 48*b* is then subjected to exposure and development processes, thereby exposing portions of the first plated layer 43 corresponding to regions where Au is to be plated. In this state, an Au plating process is carried out. In the Au plating process, current is applied to the lower surface of the base substrate so as to plate Au on desired portions of the upper surface of the base substrate. Thus, an Au plated layer 49 is formed at each exposed portion of the first plated layer 43 (FIG. 6*g*). The upper surface portions of the base plate to be plated with Au may be bond fingers.

Figure 6H:
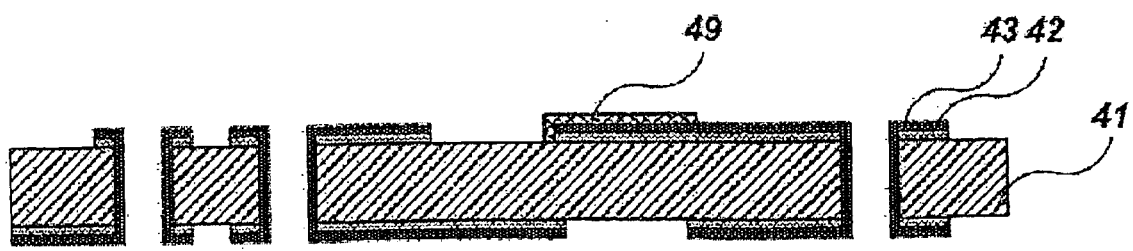

After completion of the Au plating process, the second dry film 48*a* present at the lower surface of the base substrate and the third dry film 48*b* present at the upper surface of the base substrate are stripped. The remaining second plated layer 47 of the lower surface of the base substrate is completely removed in accordance with an etching process (FIG. 6*h*). For this etching process, the above described flash etching process is used.

Figure 6I:
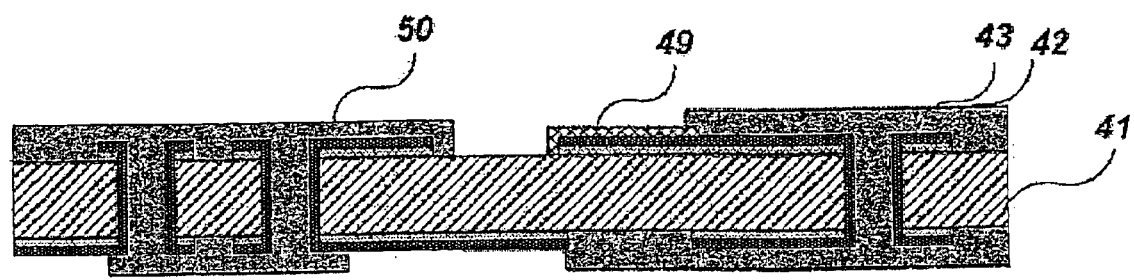

Subsequently, a solder resist is coated over the entire surface of the resultant structure, and then subjected to exposure and development processes so that it remains at desired portions of the upper and lower surfaces of the structure (FIG. 6*i*).

Figure 6J:
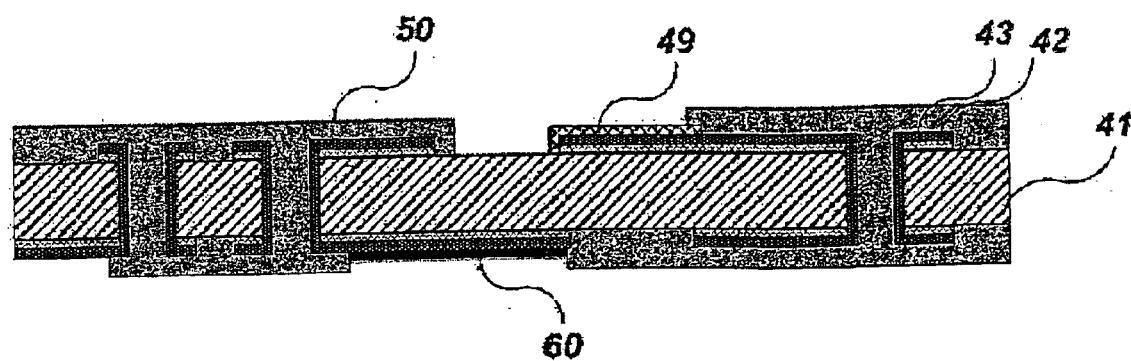

Finally, a surface treatment is carried out for a desired lower surface portion of the result structure, using an organic solderability preservative (OSP) agent, thereby forming an OSP film (60) (FIG. 6*j*).

Thus, the method of the second embodiment is characterized by the steps of tenting the upper surface portions of the base substrate corresponding to respective via holes, applying current to the lower surface of the base substrate, thereby forming the Au plated layer 49, and surface-treating an exposed portion of the copper film serving as a plating lead line at the lower surface of the base substrate by the OSP agent, as compared to the method of the first embodiment. Since the plating process can be carried out without using any external plating lead line in accordance with the second embodiment, as in the first embodiment, there is no plating lead line cutting requirement.

Figure 1:
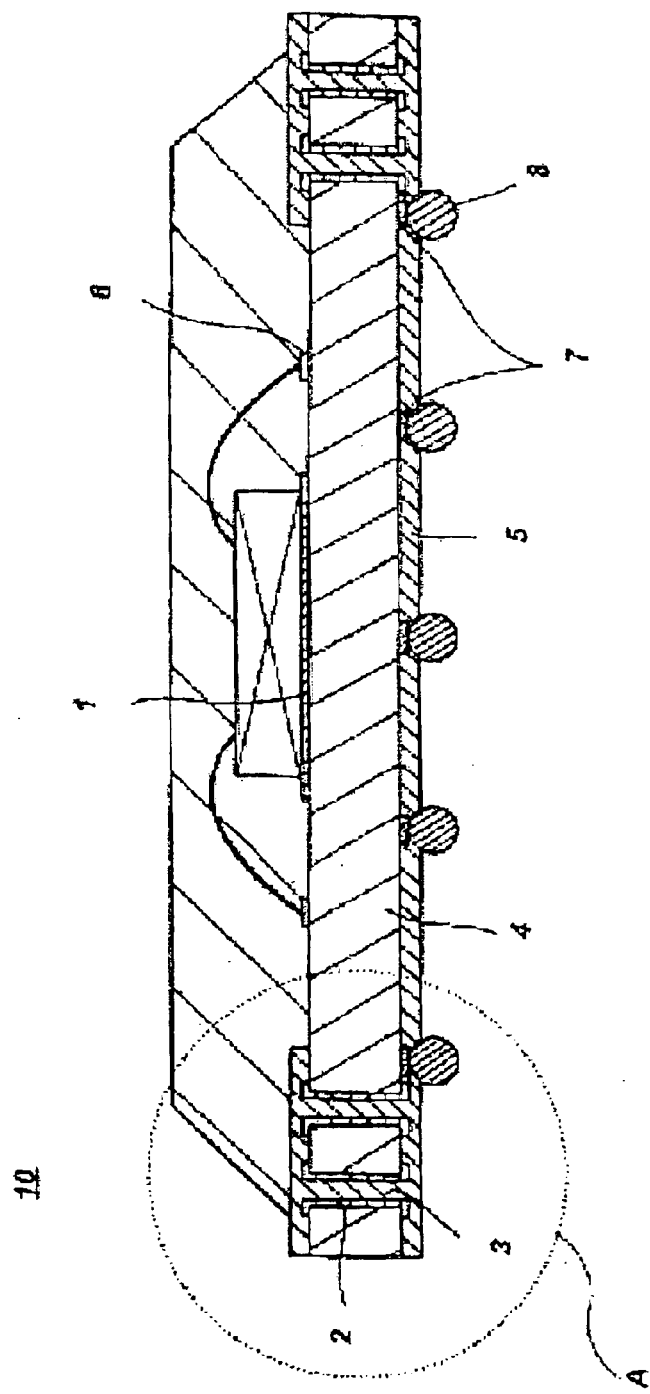
FIG. 1 is a sectional view illustrating a conventional BGA package substrate.
Figure 2:
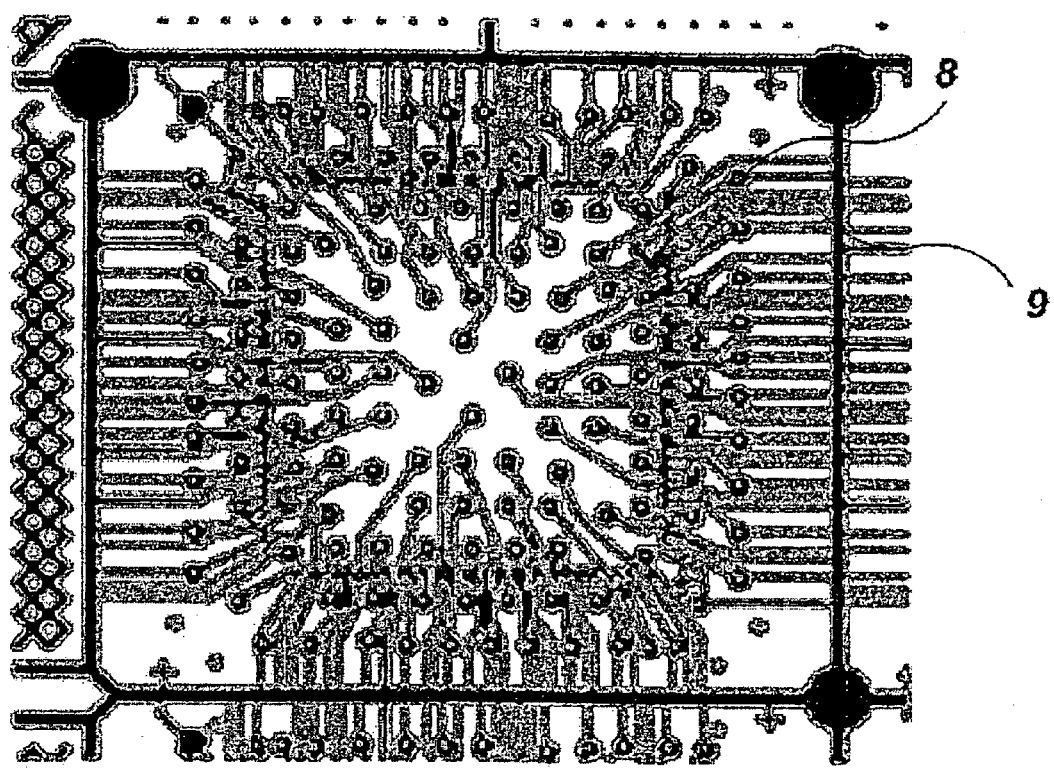
FIG. 2 is a plan view illustrating the package substrate plated using conventional plating lead lines.
Figure 3A:
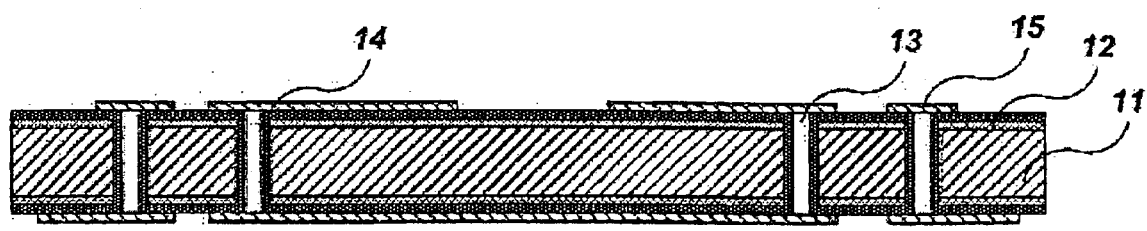
FIGS. 3a to 3f are views respectively illustrating a conventional method for manufacturing a package substrate plated with Au using plating lead lines.
Figure 3B:
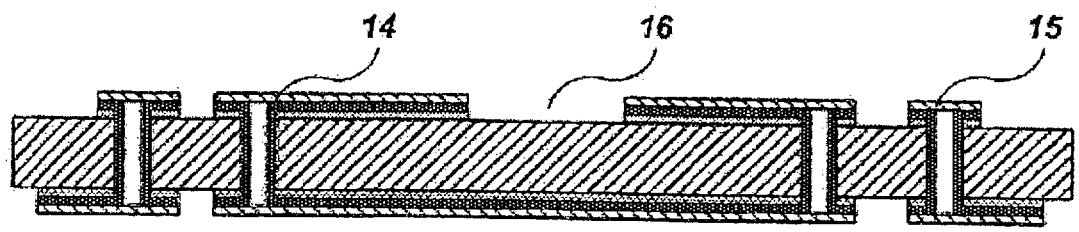
Figure 3C:
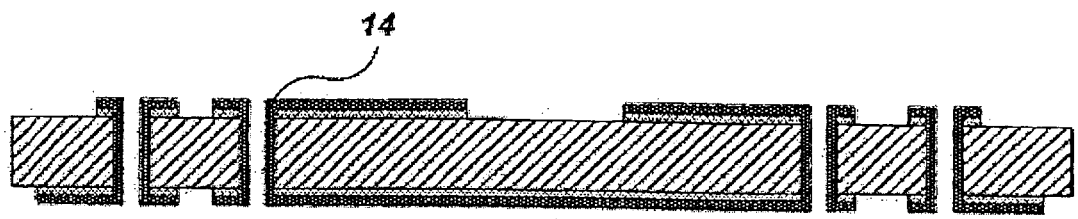
Figure 3D:
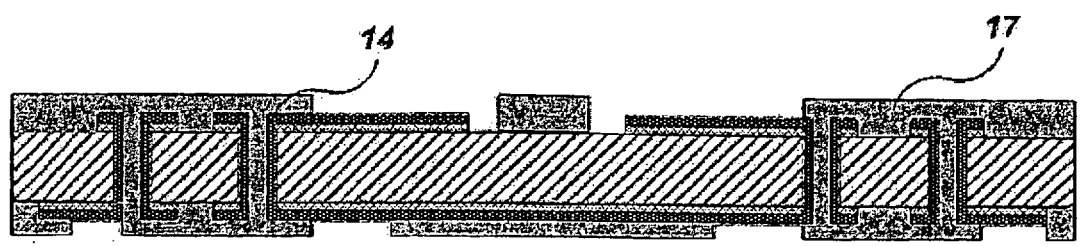
Figure 3E:
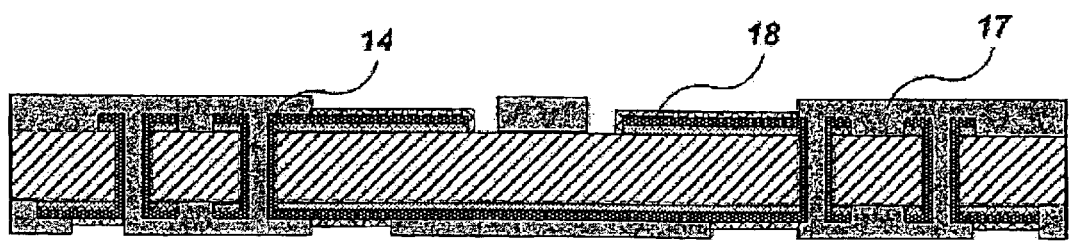
Figure 3F:
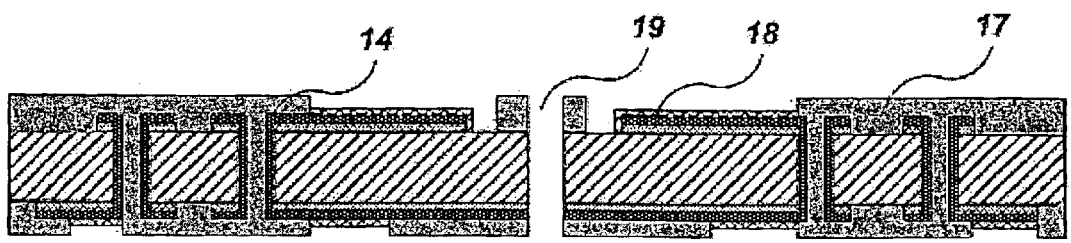
Figure 4:
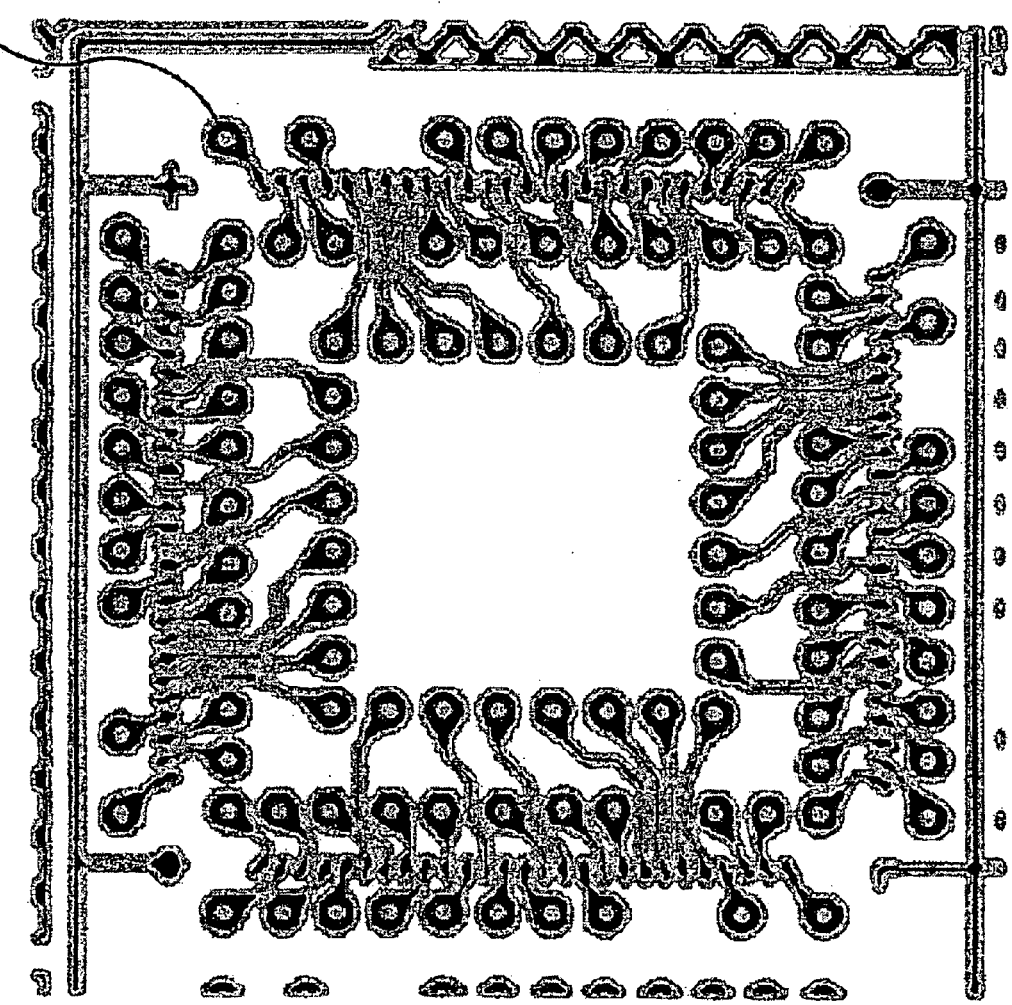
FIG. 4 is a plan view illustrating a package substrate manufactured without using any plating lead line in accordance with the present invention.

On the other hand, FIG. 4 is a plan view illustrating a package substrate manufactured without using any plating lead line in accordance with the present invention. Referring to FIG. 4, it can be found that the package substrate according to the present invention is different from the conventional package substrate of FIG. 2 in that it does not use any plating lead lines adapted to be connected to solder ball pads 20.

Figure 7A:
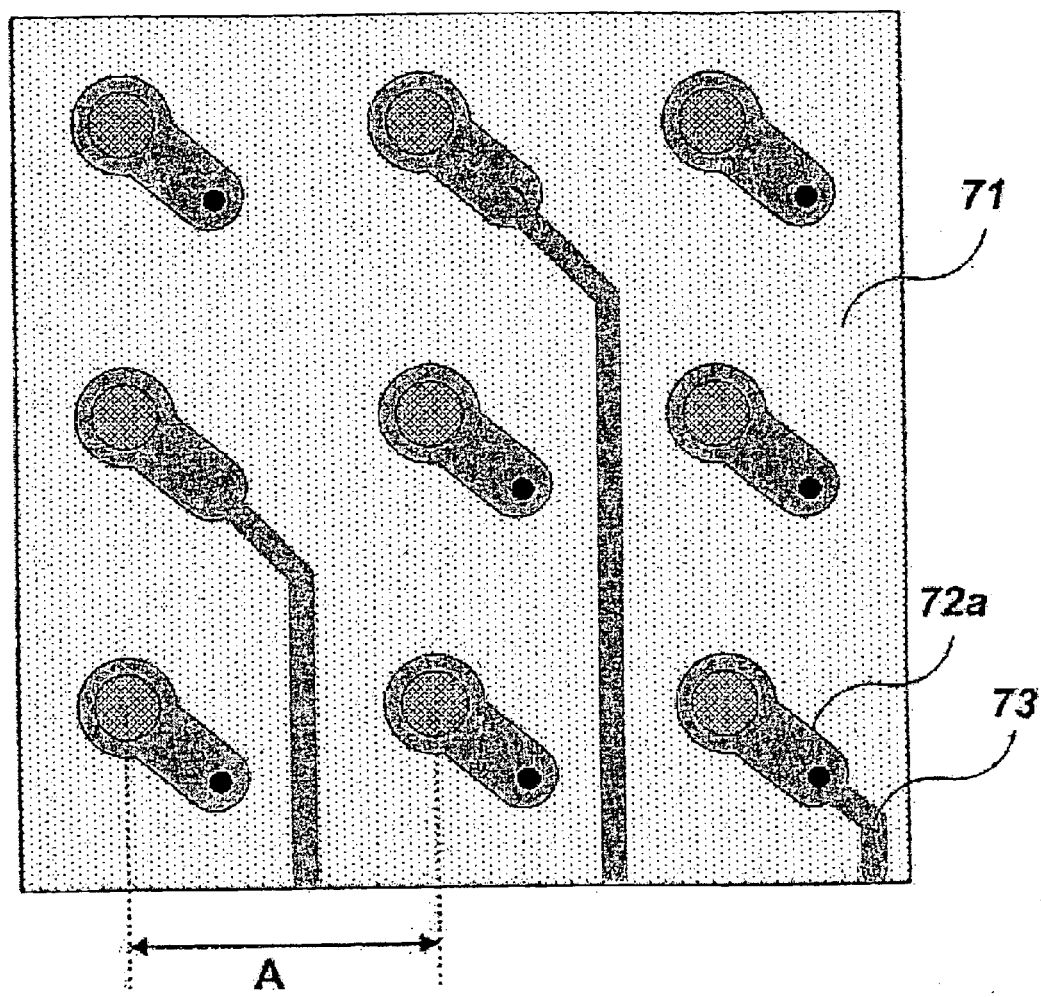
FIGS. 7a and 7b are views illustrating respective line densities of the conventional package substrate and the package substrate according to the present invention.
Figure 7B:
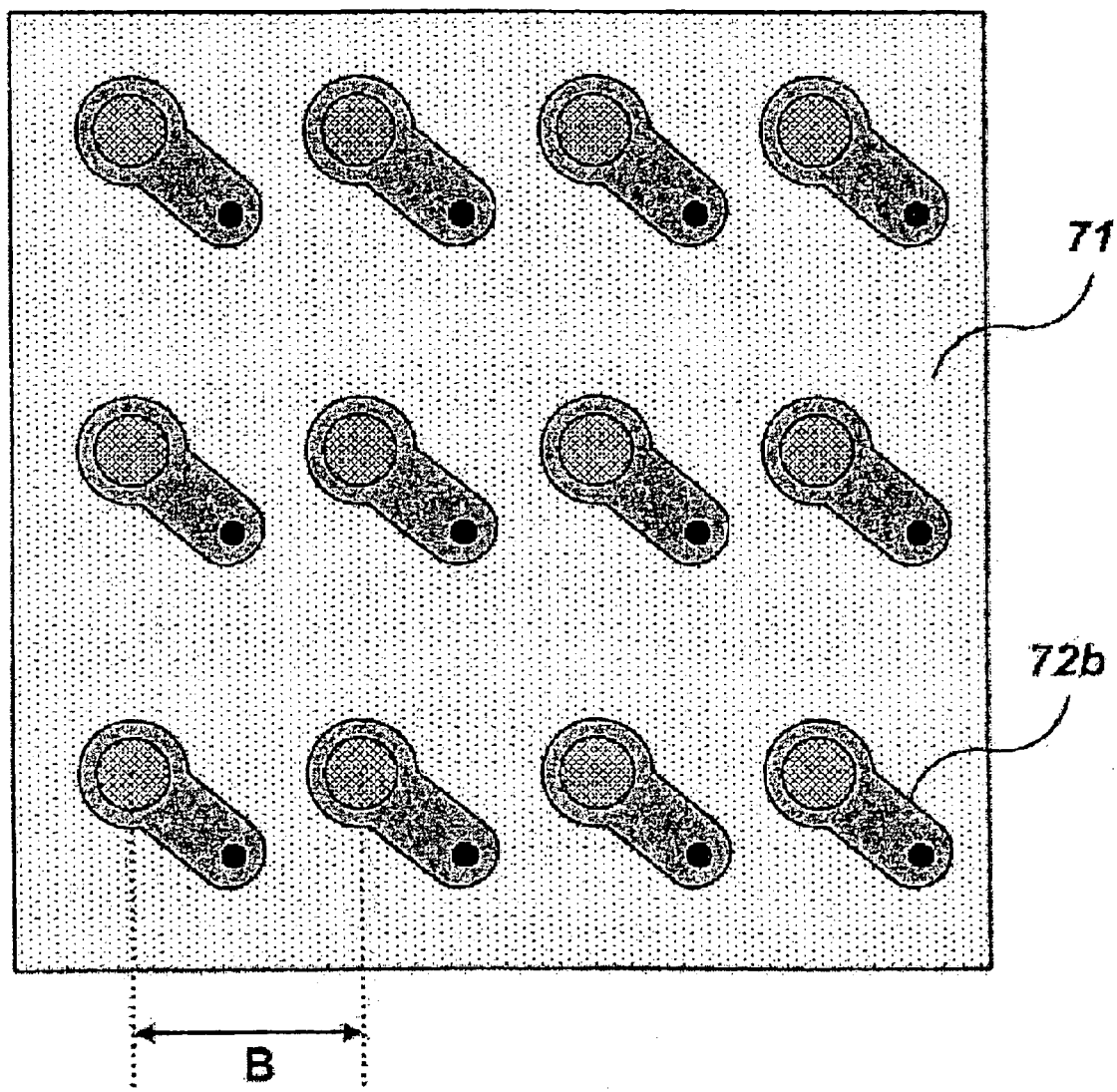

FIGS. 7*a* and 7*b* are views illustrating respective line densities of the conventional package substrate and the package substrate according to the present invention. In the conventional package substrate shown in FIG. 7*a*, solder ball pads 72*a* formed at its package substrate 71 have a ball pad pitch A defined between the centers of adjacent ones thereof. In FIG. 7*a*, the reference numeral 73 denotes a plating lead line. In the package substrate of the present invention shown in FIG. 7*b*, solder ball pads 72*b* formed at its package substrate 71 have a ball pad pitch B defined between the centers of adjacent ones thereof. Referring to FIGS. 7*a* and 7*b*, the ball pad pitch B is less than the ball pad pitch A by, for example, about 0.1 to 0.15 mm. That is, as compared to the conventional package substrate, the package substrate of the present invention can form an increased number of solder ball pads at the same area because it dispenses with the plating lead line 73 shown in FIG. 7*a*. Accordingly, an improvement in line density is achieved in accordance with the present invention.

Figure 8:
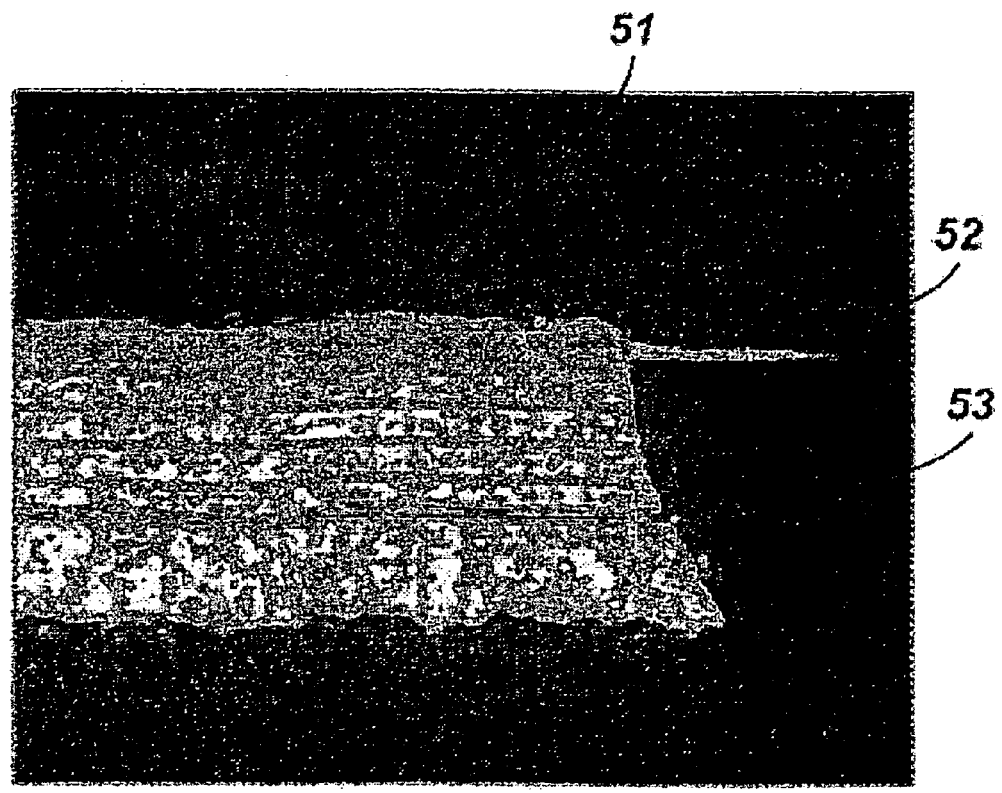
FIGS. 8 and 9 are photographs respectively showing plated structures formed in accordance with the conventional technique and the present invention.
Figure 9:
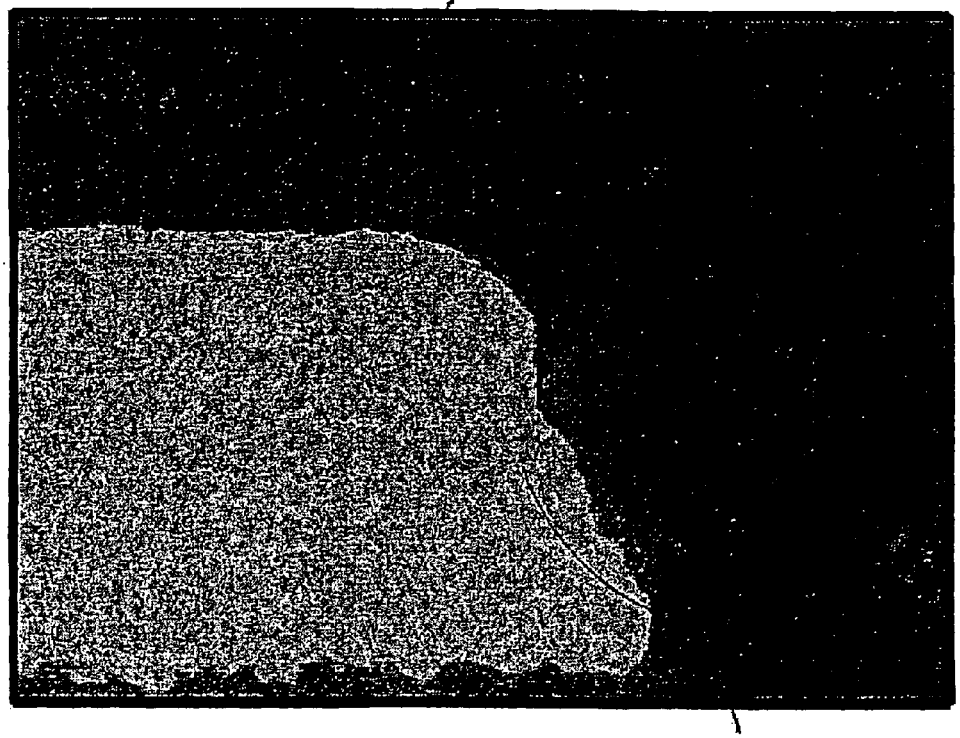

FIGS. 8 and 9 are photographs showing plated structures formed in accordance with the conventional technique and the present invention, respectively. FIG. 8 is a photograph showing a plated structure formed when an electrolytic Au/Ni plating process is carried out at the lower surface of a base substrate by use of plating lead lines in accordance with the conventional technique. FIG. 9 is a photograph showing a plated structure formed when an Au plating process is carried out without using any plating lead line in accordance with the present invention.

Referring to FIG. 8, copper (Cu) is exposed at side walls in the conventional case, as indicated by the reference numeral 52, because it is necessary to use plating lead lines when an electrolytic Au plating process is carried out at the lower surface of the package substrate, or it is necessary to carry out an etching process using an alkali etchant. In particular, nickel (Ni) is grown, as indicated by the reference numeral 53. For this reason, micro short circuits may occur.

In other words, in accordance with the conventional technique, a dry film is formed over the entire copper layer (a copper foil and a copper plated layer), and then subjected to exposure and development processes so that it is patterned. In this state, an electrolytic Au plating process is carried out. In this process, Au is plated only on exposed portions of the copper layer. After removal of the dry film, an etching process is carried out using an alkali etchant, thereby forming a circuit pattern. In this etching process, the Au/Ni layer serves as an etch resist because it does not react with the alkali etchant.

Pads formed in this process have side walls at which copper is exposed. Accordingly, where the Au plating process is carried out under the condition in which the dry film remains, the bonding force of the dry film to copper is degraded. For this reason, Au may penetrate beneath the dry film during the Au plating process. As a result, burrs may be formed.

As the etchant to be used in the etching process, one of alkali and acid etchants is selected in accordance with the material of the etch resist. In accordance with the kind of the used etchant, the structure of the pads varies.

However, where the method of FIG. 9 according to the present invention is applied, no copper is exposed at the side walls of the pads. It is also possible to prevent penetration of nickel (Ni) during the plating process. In FIG. 9, the reference numeral 51 denotes a solder resist, and the reference numeral 54 denotes an Au/Ni plated layer. In accordance with the present invention, an acid solution is used as an etchant, in place of an alkali solution. Since Ni is erodable by an acid, it cannot be applied as an etch resist against an alkali etchant. In accordance with the present invention, the side walls of the pads are plated with Ni/Au. Also, factors causing short circuits, for example, burrs, are basically avoided.

Figure 10A:
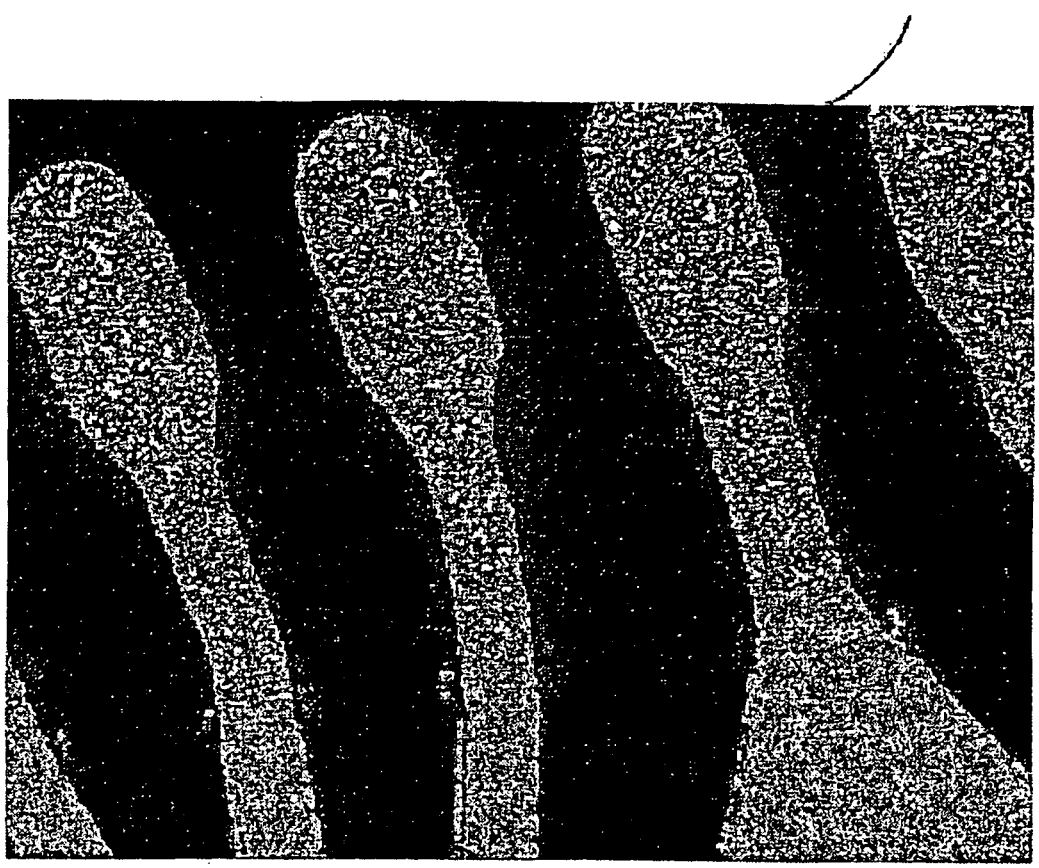
FIGS. 10a and 10b are photographs respectively showing the bond fingers and solder ball pads formed at the upper and lower surfaces of the package substrate according to the present invention.
Figure 10B:
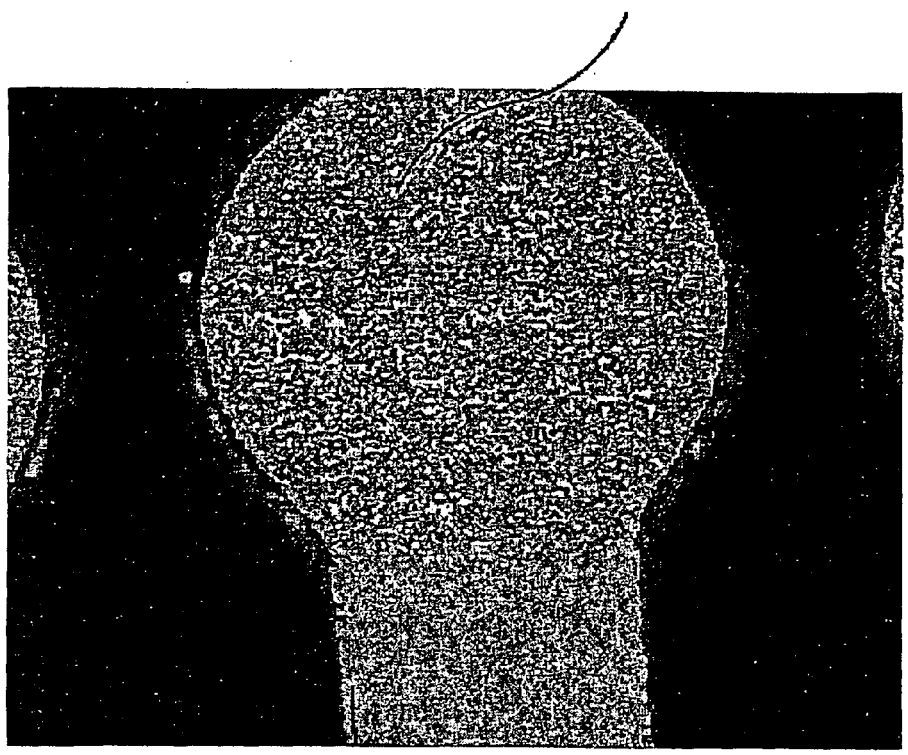

FIGS. 10*a* and 10*b* are photographs respectively showing the bond fingers and solder ball pads formed at the upper and lower surfaces of the package substrate according to the present invention. These photographs show structures of upper and lower circuits obtained prior to the solder resist forming process in accordance with the present invention. The reference numeral 55 in FIG. 10*a* denotes the bond fingers, whereas the reference numeral 56 in FIG. 10*b* denotes the solder ball pads.

As apparent from the above description, the present invention can improve the electrical characteristics of a package substrate such as a BGA package substrate or a CSP package substrate by carrying out an electrolytic Au plating process for the package substrate without using any plating lead line. Also, the present invention improves the design freedom of circuits by virtue of dispensing with plating lead lines. It is also possible to reduce the pitch of ball pads by about 0.1 to 0.15 mm, as compared to the ball pad pitch in conventional cases. Thus, package substrates having highly integrated circuits can be manufactured.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

In accordance with the present invention, it is possible to prevent generation of signal noise caused by residue of plating lead lines for an electrolytic Au plating process, thereby achieving an improvement in the electrical characteristics of a package substrate.

In accordance with the present invention, it is also possible to improve the design freedom (flexibility) of circuits by virtue of dispensing with plating lead lines. Accordingly, there is an advantage in manufacturing package substrates having highly integrated circuits.

In accordance with the present invention, solder ball pads are surface-treated by an Au plating process, so that no copper is exposed. Accordingly, there is an improvement in the characteristics of the package substrate.

What is claimed is:

1. A method for manufacturing a package substrate without using any plating lead line, comprising the steps of:
    a) laminating first dry films over upper and lower surfaces of a base substrate having via holes plated with a copper film and being formed at the upper and lower surfaces thereof with copper foils, and subjecting the first dry films to exposure and development processes, thereby exposing predetermined upper and lower surface portions of the base substrate;
    b) removing portions of the copper foils not covered by the first dry films in accordance with an etching process, thereby forming circuits on the upper and lower surfaces of the base substrate, respectively;
    c) stripping the first dry films, and forming a plated layer over all portions of the base substrate in accordance with an electroless plating process;
    d) laminating second dry films over the plated upper and lower surfaces of the base substrate, and subjecting the second dry films to exposure and development processes, thereby exposing portions of the plated upper and lower surfaces of the base substrate respectively corresponding to regions where Au is to be plated;
    e) removing the plated layer from the exposed upper and lower surface portions of the base substrate respectively corresponding to the regions where Au is to be plated, in accordance with an etching process;
    f) plating Au on the exposed upper and lower surface portions of the base substrate;
    g) stripping the second dry films, and removing the plated layer remaining on the base substrate in accordance with an etching process, thereby exposing the upper and lower circuits of the base substrate; and
    h) coating a solder resist on the exposed upper and lower circuits of the base substrate while exposing predetermined portions of the upper and lower circuits.

2. The method according to claim 1, wherein the first and second dry films are used as etch resists, respectively.

3. The method according to claim 1, wherein the electroless plating process is carried out by chemically plating a conductor in a state in which bus lines of the upper and lower circuits are completely removed after completion of the etching process at the step (b).

4. The method according to claim 3, wherein the conductor is a copper layer having a thickness of 0.5 to 1.0 $\mu$m.

5. The method according to claim 1, wherein each of the etching processes is a flash etching process.

6. The method according to claim 1, wherein the plated layer formed in the electroless plating process is a conductor serving as a plating lead line for supplying current during an electrolytic plating process for the plating of Au.

7. The method according to claim 1, wherein the exposed upper surface portions of the base substrate respectively corresponding to the regions where Au is to be plated are bonded fingers.

8. The method according to claim 1, wherein the exposed lower surface portions of the base substrate respectively corresponding to the regions where Au is to be plated are solder ball pads.

9. A method for plating Au on a package substrate, comprising the steps:
    a) laminating first dry films over upper and lower surfaces of a base substrate having via holes plated with a copper film and being formed at the upper and lower surfaces thereof with copper foils, and subjecting the first dry films to exposure and development processes, thereby exposing predetermined upper and lower surface portions of the base substrate;
    b) removing portions of the copper foils not covered by the first dry films in accordance with an etching process, thereby forming circuits on the upper and lower surfaces of the base substrate, respectively;
    c) stripping the first dry films, and forming a plated layer over all portions of the base substrate in accordance with an electroless plating process;
    d) laminating second dry films over the plated upper and lower surfaces of the base substrate, and subjecting the second dry films to exposure and development processes, thereby exposing portions of the plated upper and lower surfaces of the base substrate respectively corresponding to regions where Au is to be plated;
    e) removing the plated layer from the exposed upper and lower surface portions of the base substrate respectively corresponding to the regions where Au is to plated, in accordance with an etching process; and
    f) plating Au on the exposed upper and lower surface portions of the base substrate, whereby the base substrate is plated with Au without using any plating lead line.

10. The method according to claim 9, wherein the electroless plating process is carried out by chemically plating a conductor in a state in which bus lines of the upper and lower circuits are completely removed after completion of the etching process at the step (b).

11. The method according to claim 10, wherein the conductor is a copper layer having a thickness of 0.5 to 1.0 $\mu$m.

12. The method according to claim 9, wherein each of the etching processes is a flash etching process.

13. The method according to claim 9, wherein the plated layer formed in the electroless plating process is a conductor serving as a plating lead line for supplying current during an electrolytic plating process for the plating of Au.

14. A method for electrolytically plating Au on a package substrate without using any plating lead line, comprising the steps of:

a) laminating first dry films over upper and lower surfaces of a base substrate having via holes plated with a copper film and being formed at the upper and lower surfaces thereof with copper foils, and subjecting the first dry films to exposure and development processes, thereby exposing predetermined upper and lower surface portions of the base substrate;

b) removing portions of the copper foils not covered by the first dry films in accordance with an etching process, thereby forming circuits on the upper and lower surfaces of the base substrate, respectively;

c) stripping the first dry films, and forming a plated layer over all portions of the base substrate in accordance with an electroless plating process;

d) laminating second dry films over the plated upper and lower surfaces of the base substrate, respectively and subjecting the second dry film laminated over the plating upper surface of the base substrate to exposure and development processes, thereby exposing predetermined portions of the plated upper surface of the base substrate, while tenting the via holes;

e) removing the plated layer from the exposed upper surface portion of the base substrate in accordance with an etching process;

f) laminated a third dry film over an upper surface of a structure obtained after completion of the step (e), subjecting the third dry film to exposure and development processes, thereby exposing portions of the upper surface of the base substrate respectively corresponding to regions where Au is to be plated, and plating Au on the exposed upper surface portions of the base substrate;

g) stripping the second dry film laminated on the lower surface of the substrate, and the third dry film remaining on the upper surface of the structure, and removing the plated layer remaining on the lower surface of the base substrate in accordance with an etching process, thereby exposing the upper and lower circuits of the base substrate;

h) coating a solder resist over the exposed upper and lower circuits of the base substrate, and subjecting the solder resist to exposure and development processes, thereby exposing predetermined portions of the upper and lower circuits; and i) surface-treating the exposed of the lower circuit by use of an organic solderability preservative agent.

* * * * *